(12) United States Patent
Eckberg et al.

(10) Patent No.: US 10,939,571 B2
(45) Date of Patent: Mar. 2, 2021

(54) CABLE MANAGEMENT FOR ENCLOSURES

(71) Applicant: International Business Machines Corporation, Armonk, NY (US)

(72) Inventors: Eric A. Eckberg, Rochester, MN (US); Stephen P. Mroz, Rochester, MN (US); Paul W. Schaefer, Rochester, MN (US); Sandra J. Shirk/Heath, Rochester, MN (US); Christopher L. Tuma, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/589,171

(22) Filed: Oct. 1, 2019

(65) Prior Publication Data

US 2020/0053899 A1 Feb. 13, 2020

Related U.S. Application Data

(62) Division of application No. 15/352,894, filed on Nov. 16, 2016, now Pat. No. 10,542,631.

(51) Int. Cl.
*H05K 7/14* (2006.01)
*B23P 13/00* (2006.01)

(52) U.S. Cl.
CPC ............ *H05K 7/1417* (2013.01); *B23P 13/00* (2013.01); *H05K 7/1491* (2013.01)

(58) Field of Classification Search
CPC ..... H05K 7/1417; H05K 7/1491; B23P 13/00; A47C 19/025; A47C 19/021; A47C 19/005; A47C 17/645; H04Q 1/06
See application file for complete search history.

(56) References Cited

U.S. PATENT DOCUMENTS

| | | | |
|---|---|---|---|
| 8,757,560 B2 | 6/2014 | Darnell | |
| 9,054,449 B2 | 6/2015 | Utz et al. | |
| 9,502,823 B2 | 11/2016 | Liu et al. | |
| 10,039,202 B2 | 7/2018 | Eckberg et al. | |
| 2002/0074149 A1 | 6/2002 | Lawrence et al. | |
| 2005/0057912 A1 | 3/2005 | Hardt et al. | |
| 2006/0193112 A1 | 8/2006 | Cauthron | |

(Continued)

FOREIGN PATENT DOCUMENTS

| | | |
|---|---|---|
| EP | 2670160 A1 | 12/2013 |
| WO | 02076111 A2 | 9/2002 |
| WO | 2010025855 A1 | 3/2010 |

OTHER PUBLICATIONS

Fujiwara et al., "Cabinet Layout Optimization of Supercomputer Topologies for Shorter Cable Length", 2012 13th International Conference on Parallel and Distributed Computing, Applications and Technologies, pp. 227-232, © 2012 IEEE.

(Continued)

*Primary Examiner* — Robert Sandy
*Assistant Examiner* — Louis A Mercado
(74) *Attorney, Agent, or Firm* — James L. Olsen (57) ABSTRACT

Provided is a cable retention device configured to facet attachments and projections onto an enclosure. The device includes an inner and outer planar layer which include an inner and outer cutout respectively. The inner and outer planar layers are attached and aligned so the inner and outer cutouts overlap. The inner planar layer includes a pair of vertical slotted cutouts connected by a center cutout to form a plurality of pinch points. Each vertical slotted cutout includes an inner edge and an outer edge.

20 Claims, 8 Drawing Sheets

(56) References Cited

U.S. PATENT DOCUMENTS

| | | |
|---|---|---|
| 2009/0101603 A1 | 4/2009 | Hilburn et al. |
| 2011/0211329 A1 | 9/2011 | Dean, Jr. et al. |
| 2015/0362691 A1 | 12/2015 | Montgelas et al. |
| 2016/0349806 A1 | 12/2016 | Whang et al. |
| 2018/0139860 A1 | 5/2018 | Eckberg et al. |
| 2018/0139861 A1 | 5/2018 | Eckberg et al. |

OTHER PUBLICATIONS

IBM, "Model 7014-T42, 704-B42, and 0553 rack," Power5, IBM Knowledge Center, http://www.ibm.com/support/ knowledgecenter/POWER5/iphad_p5/f7014t42rack.html, last printed Nov. 3, 2016, 3 pgs.

IBM, "IBM 42U and 47U 1200mm Deep Static and 42U 1200mm Deep Dynamic Racks for System x," https://www-01.ibm.com/common/ssi/rep_ca/3/877/ENUSZG10-0303/ENUSZG10-0303.PDF, Sep. 7, 2010, 11 pgs.

IBM, "Model 7953-94X and 7965-94Y rack," Power 7, IBM Knowledge Center, http://www.ibm.com/support/knowledgecenter/POWER7/p7had/p7had795394xrack.html, last printed Nov. 3, 2016, 3 pgs.

IBM, List of IBM Patents or Patent Applications Treated as Related, Sep. 30, 2019, 2 pages.

CABLE MANAGEMENT FOR ENCLOSURES

BACKGROUND

The present disclosure relates generally to the field of electronics enclosures, and more particularly to rack cable management.

Enclosures, such as frames and cabinets, have been used to mount and store electrical components for many years. Enclosures typically include a chassis, which may be configured to mount brackets and shelves. The brackets and shelves may be configured to house electronic components, such as audio, video, and network devices or server computers. The electronic components housed in the enclosure may be connected to each other and to other components housed elsewhere via one or more cables that need to be routed throughout the enclosure and properly managed.

SUMMARY

Embodiments of the present disclosure include a cable retention device for faceting projections or attachments onto a computer enclosure. The device includes an inner planar layer and an outer planar layer. The inner and outer planar layers include an inner and an outer cutout, respectively. The inner and outer planar layers may be aligned so the inner and outer cutouts at least partially overlap. The inner cutout includes a pair of substantially parallel vertical slotted cutouts connected by a center cutout to form a plurality of pinch points. Each vertical slotted cutout includes an inner edge and an outer edge.

Further embodiments of the present disclosure include a method for manufacturing a cable retention device for faceting projections onto a computer enclosure. An outer cutout may be formed on a first panel. An inner cutout may be formed on a second panel. The inner cutout may include a pair of vertical slotted cutouts. The vertical slotted cutouts may be substantially parallel to each other, and they may be connected by a center cutout so as to form a plurality of pinch points between the vertical slotted cutouts. The first panel and the second panel may be attached so that the inner and outer cutouts at least partially overlap.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Like reference numbers and designations in the various drawings indicate like elements. Dimensions of various aspects of the drawings are intended to be representative and may not be to scale.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronics enclosures, and more particularly to rack cable management. While the present disclosure is not necessarily limited to such applications, various aspects of the disclosure may be appreciated through a discussion of various examples using this context.

As the density of information technology equipment increases, so does the amount of required cabling. While the cable volume increases, the rack width is typically fixed to, for example, match the rack tiles in data centers. For example, rack width may be fixed at a maximum 600 mm to match standards set by the ELECTRONIC COMPONENTS INDUSTRY ASSOCIATION® (Electronic Components Industry Association non-profit corporation ILLINOIS 1111 Alderman Dr., Suite 400 Alpharetta GEORGIA 30005), as this width aligns with the tiles of most data centers.

In the industry, current enclosure designs are not able to manage the overwhelming increase in cable volume at a constant rack width, requiring installers to depopulate equipment and/or add expensive extender sub-racks to spread out cabling. Unresolved cable management issues may lead to undesired bending of cables, overheating, obstructed airflow, or difficulty administering changes in the current enclosure design. Additionally, current cable management solutions require cable tie-downs that protrude either into the enclosure or out of the enclosure. This causes a number of problems. For example, protrusions that stick out from the enclosure wall or panel into the interior of the enclosure may prohibit removal and insertion of computer components from, or into, the enclosure or rack. Protrusions outside of the enclosure may cause the widest point of the enclosure to exceed industry standards, or otherwise interfere with neighboring enclosures.

The present disclosure relates to a cable retention device, which may be used to facet projections and attachments onto an enclosure in order to properly manage cables or other equipment within the enclosure. The cable retention device may include a double-layered panel with a cutout on each layer. The inner cutout may include a pair of vertical slotted cutouts connected by a center cutout to form a plurality of pinch points which may be used to facet projections and attachments onto an enclosure. The outer cutout may be sized and shaped to receive and retain projections within the enclosure.

Embodiments of the cable retention device may be compact and unobtrusive, allowing the most room for cabling and other components (e.g., power distribution units (PDUs) and vertical water manifolds) within the enclosure. Some embodiments of the cable retention device may be flush with surrounding material to ensure it does not interfere with other components within the enclosure. Furthermore, it may be relatively small, allowing a plurality of the cable retention devices to be disposed on each enclosure. A compact design may also allow the cable retention device to facet projections and attachments onto the enclosure without extruding beyond the enclosure width. The thickness of the panels may be configured so that projections and attachments do not extrude beyond the enclosure width.

Some embodiments of the cable retention device may also be cost efficient, in that they may be easily and cheaply fabricated. The cable retention device may be formed with any suitable manufacturing method, such as stamping, punching, cutting, computer numerical controlled (CNC) machining, or pressing. These manufacturing methods allow rapid, inexpensive, and large quantity production of cable retention devices, as repetitive punches may be formed on the layers.

Embodiments of the cable retention device may also be flexible, as they may be positioned in various locations. The cutouts may be formed on any suitable material, such as metal, glass, ceramic, composites, or polymers. In sheet metal enclosure embodiments, the cutouts may be placed closer to sheet metal features as compared to protruding cutouts. Protruding cutouts require additional spacing from sheet metal features to allow the metal to bend. Furthermore, protruding cutouts may require additional space to access the cutout, which may be obstructed if placed in proximity to a sheet metal feature (e.g., a bend or attachment point). The cable retention device may be placed on panels, brackets, shelves or any other feature on an enclosure.

Additionally, some embodiments of the cable retention device may be versatile, as they may be multifunctional. The cable retention device may secure projections such as screws, bolts, and nails within the center cutout or vertical slotted cutouts within the pinch points. These projections may be configured to attach shelves, brackets, or other components onto the enclosure. The outer cutout may be configured to (e.g., sized and shaped to) immobilize projections by accommodating the size and shape of the selected projection. The vertical slotted cutouts may likewise be configured to receive and retain tie attachments such as straps, hooks, loops, and rings. These tie attachments may secure cables, PDUs, wires or other components onto the enclosure.

Furthermore, the cable management system may be durable enough to endure shipping environments. In some examples, the enclosure may be formed with sheet metal for durability. This may allow the computer components to be housed within the enclosure during shipping, instead of requiring the computer components and the enclosure be separately shipped and assembled upon arrival.

In some embodiments, the cable retention device may allow securing projections or attachments from entirely the inside of the enclosure. This may be particularly advantageous as there may be walls or other enclosures populating the area outside of the enclosure width. The cable retention device may include a pair of peripheral tabs to facilitate feeding projections into the vertical slotted cutouts from entirely the inside of the enclosure. The projection may be inserted into the combined length of the peripheral tab cutouts and the vertical slotted cutouts. The projection may then be repositioned and immobilized within the walls of the vertical slotted cutouts. Furthermore, the center cutout facilitates inserting tie attachments into the vertical slotted cutouts from entirely the inside of the enclosure. Tie attachments may be contorted and inserted into the center cutout, then retained by the pinch points.

It is to be understood that the aforementioned advantages are example advantages and should not be construed as limiting. Embodiments of the present disclosure can contain all, some, or none of the aforementioned advantages while remaining within the spirit and scope of the present disclosure.

Figure 1A:
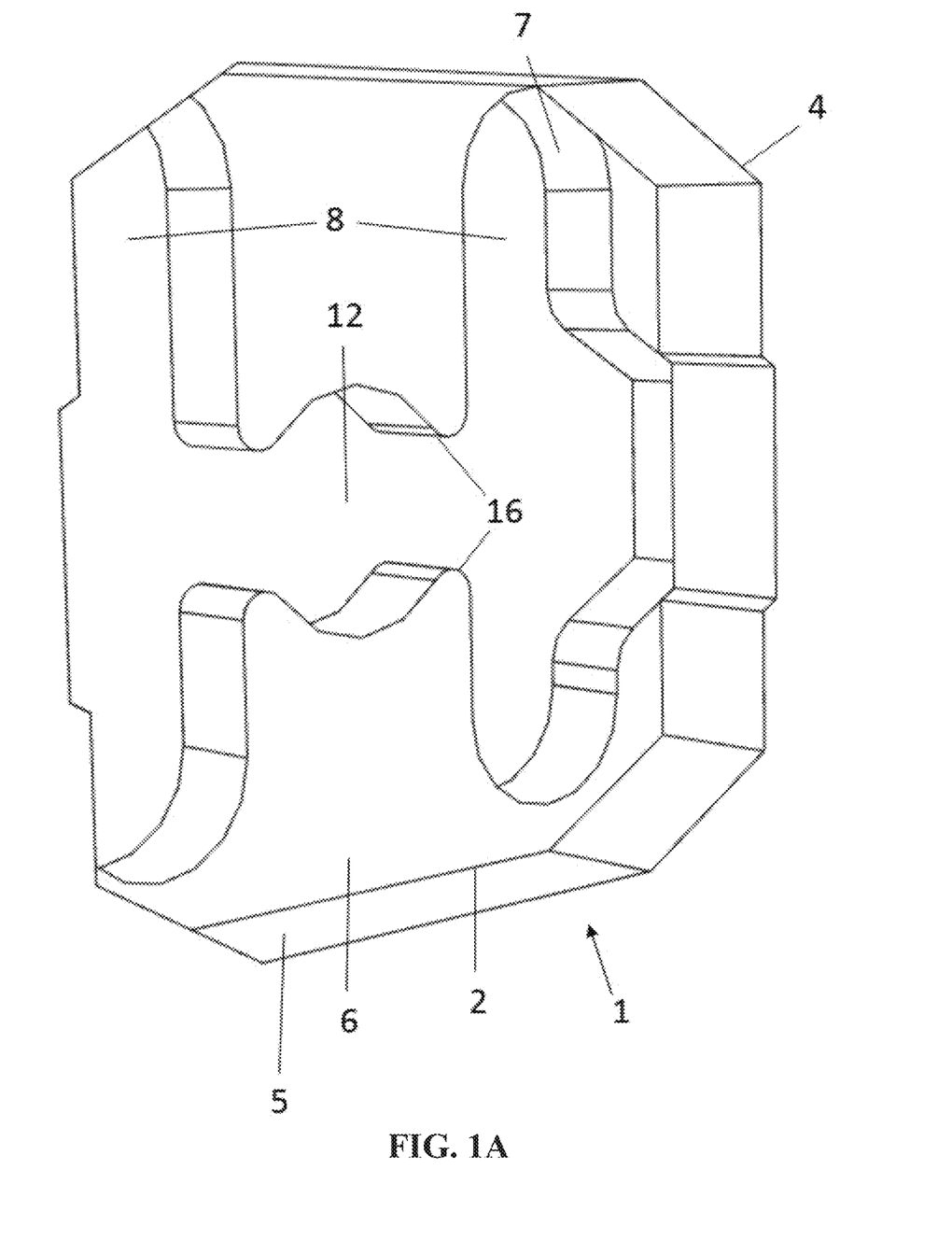
FIG. 1A illustrates an isometric view of a cable retention device, in accordance with embodiments of the present disclosure.

FIG. 1A illustrates an isometric view of a cable retention device 1 having an outer planar layer 4 and an inner planar layer 6, in accordance with embodiments of the present disclosure. The outer and inner planar layers 4, 6 may be joined at an attachment point 2. The outer planar layer 4 may include an outer cutout 5 and the inner planar layer 6 may include an inner cutout 7. The outer and inner planar layers 4, 6 may be aligned or attached so the outer and inner cutouts 5, 7 at least partially overlap. The cable retention device 1 may be configured to receive and retain attachments. In some embodiments, the inner cutout 7 includes vertical slotted cutouts 8. As depicted in FIG. 1A, the vertical slotted cutouts 8 may be substantially parallel to each other. For example, the vertical slotted cutouts 8 may be substantially elliptical in shape, with a major axis that runs through the vertical slotted cutouts 8 in the longer direction, and a minor axis that runs through the vertical slotted cutouts 8 in the shorter direction. The vertical slotted cutouts 8 may be considered substantially parallel if their major or minor axis are parallel or form an angle of less than 10 degrees. The vertical slotted cutouts 8 may be connected with a center cutout 12 to form a plurality of pinch points 16.

The center cutout 12 may be configured to receive and retain projections (e.g., fasteners) by immobilizing projections within the pinch points 16. In some embodiments, the center cutout 12 may be substantially circular, allowing the inner cutout 7 to receive and retain circular projections such as screws, bolts, nails, stakes, posts, poles, rivets, wires, ropes, or any other substantially circular projection. In some embodiments, the center cutout 12 may be polygon shaped (e.g., a triangle, diamond, square, pentagon, hexagon, octagon). In some embodiments, the center cutout 12 may be rounded on the top and flat on the bottom, or vice versa. Varying the size, placement, and shape of the center cutout 12 alters the shape and placement of the pinch points 16, which allow the pinch points 16 to immobilize a range of projections depending on the selected geometry. It is to be understood that the size and shape of the center cutout 12 as shown in FIG. 1A is exemplary, and that any size or shape otherwise consistent with this disclosure is contemplated.

The vertical slotted cutouts 8 may be configured to receive and retain tie attachments. In some embodiments, the center cutout 12 facilitates inserting tie attachments between the vertical slotted cutouts 8. Tie attachments may be retained within the vertical slotted cutouts 8 by trapping the tie attachments within the distance between the pinch points 16. The dimensions of the vertical slotted cutouts 8, the center cutout 12, and the pinch points 16 may be sized and shaped depending on the coupled tie attachment. Various tie attachments may be used, such as VELCRO® Straps (Velcro Industries B.V. LIMITED LIABILITY COMPANY NETHERLANDS Castorweg 22-24 Curacao NETHER- LANDS), zip-ties, hooks, loops, and rings. The distance between the upper and lower pinch points 16 may be smaller than the width of the tie attachment so the tie attachment remains retained within the pair of vertical slotted cutouts 8. Inserting tie attachments through the center cutout 12 may be advantageous as it allows faceting tie attachments between the vertical slotted cutouts 8 from one side of the cable retention device 1. This may be useful when an enclosure is only accessible from the inside, as it allows tie attachments to be secured entirely from the inside of the enclosure. This problem frequently arises in server rack systems, as rooms are typically dimensioned to place each enclosure in an area defined by the enclosure width. In multiple rack systems, there may be little to no space between server racks, which may make it necessary to insert tie attachments and projections from entirely the inside of the enclosure.

Figure 1B:
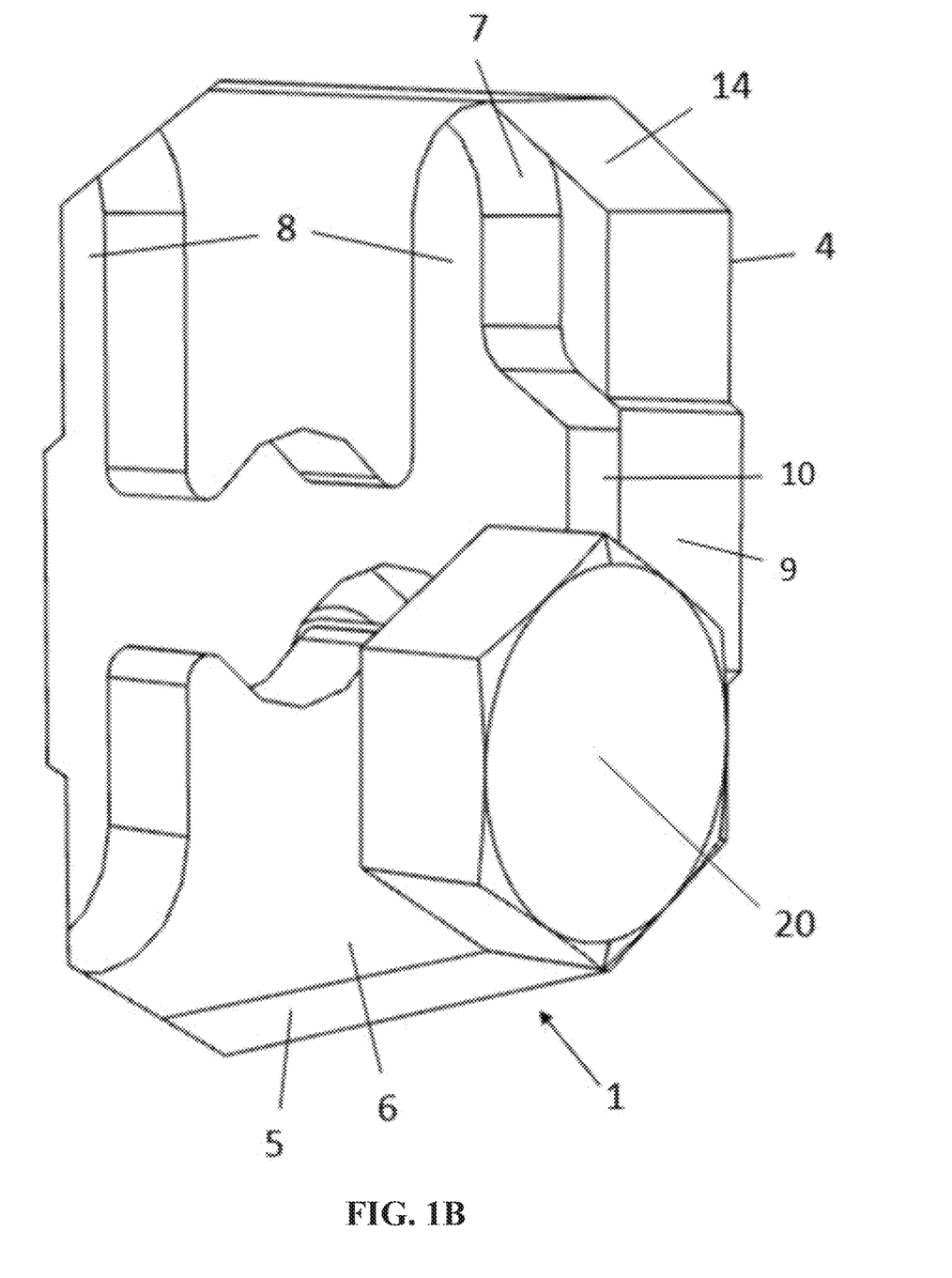
FIG. 1B depicts an isometric view of the cable retention device with a hex bolt, in accordance with embodiments of the present disclosure.

FIG. 1B depicts an isometric view of the cable retention device 1 with a hex bolt 20, in accordance with embodiments of the present disclosure. The outer cutout 5 may be sized and shaped to accommodate specific projections. In some embodiments, the outer cutout 5 is substantially square shaped with corners 14 to accommodate the hex bolt 20. The corners 14 may be sized and shaped to accommodate specific projections. For example, as shown in FIG. 1B, the corners 14 are sized and shaped (e.g., have a specific angle) that allows the hex bolt 20 to fit securely in the bottom of one of the vertical slotted cutouts 8 such that an edge of the hex bolt 20 rests flush with one of the corners 14. In some examples, the corners 14 are chamfered or filleted.

Projections may be inserted into the vertical slotted cutouts 8 through outer and inner peripheral tab cutouts 9, 10. The peripheral tab cutouts may increase the combined length required to access the vertical slotted cutouts 8, allowing a user to insert a projection from entirely the inside of the enclosure. For example, the hex bolt 20 may be inserted directly into the vertical slotted cutouts 8 through the outer and inner peripheral tab cutouts 9, 10. The outer and inner peripheral tab cutouts 9, 10 may be disposed on the outer and inner cutouts 5, 7 respectively, to facilitate adding projections wider than the vertical slotted cutouts 8. The outer and inner peripheral tab cutouts 9, 10 may be sized and shaped depending on the selected projection. In some embodiments, the peripheral tab cutouts may be rounded to facilitate adding screws or other round projections.

The hex bolt 20 may be tilted diagonally to allow the head to fit through the combined length of the vertical slotted cutouts 8 and the peripheral tab cutouts. In some embodiments, the outer peripheral tab cutout 9 may be narrower than the inner peripheral tab cutout 10. This configuration may be implemented to retain a feature on a projection (e.g., a hex bolt 20 head) within the niche of the outer peripheral tab cutout 9. However, in some embodiments the inner peripheral tab cutout 10 may be narrower than the outer peripheral tab cutout 9. Furthermore, the outer and inner peripheral tab cutouts 9, 10 may have similar or the same dimensions. Overall, the peripheral tab cutouts allow projections to be inserted into the cable retention device 1 from entirely the inside of the enclosure. The hex bolt 20 may be locked into place in the corner 14. This is because the corner 14 may be chamfered to be flush with sides of the hex bolt 20 head, preventing twisting of the hex bolt 20. Immobilizing the hex bolt 20 in the corner 14 allows nuts or other attachments to fasten onto the hex bolt 20 without unwanted twisting of the hex bolt 20. In other embodiments, the corners 14 may be filleted to accommodate round projections, such as screws. The size and shape (e.g., angle) of the corners 14 may be selected based on the types of projections used. This allows attachments such as brackets, shelves, or extensions to be coupled to the cable retention device 1 using the projection.

The outer and inner planar layers 4, 6 may be sized and shaped to accommodate specific projections. The thickness of the outer and inner planar layers 4, 6 may be selected based on the coupled attachments or projections. It may be necessary to ensure tie attachments or projections do not extrude beyond the enclosure's base width, as there may be walls or other enclosures populating the space. Accordingly, the outer planar layer 4 may be dimensioned to accommodate the height of attachments and projections to ensure they remain within the enclosure width. As depicted in FIG. 1B, the height of the hex bolt 20 does not exceed the depth of the outer planar layer 4 (e.g., does not protrude beyond the outer wall of the enclosure). In other words, the thickness of the outer planar layer 4 may be the same as, or greater than, the thickness of the head of the hex bolt 20. Likewise, the outer and inner planar layers 4, 6 may overlap such that the bottom of the vertical slotted cutouts 8 do not extend all of the way to the bottom of the outer planar layer 4. Instead, there may be a gap left such that the bottom of head of the hex bolt 20 (e.g., the portion of the hex bolt's 20 head that is closest to the shank of the hex bolt 20) can lay flush against the inner planar layer 4 such that the hex bolt 20 does not fall into the enclosure.

Figure 2A:
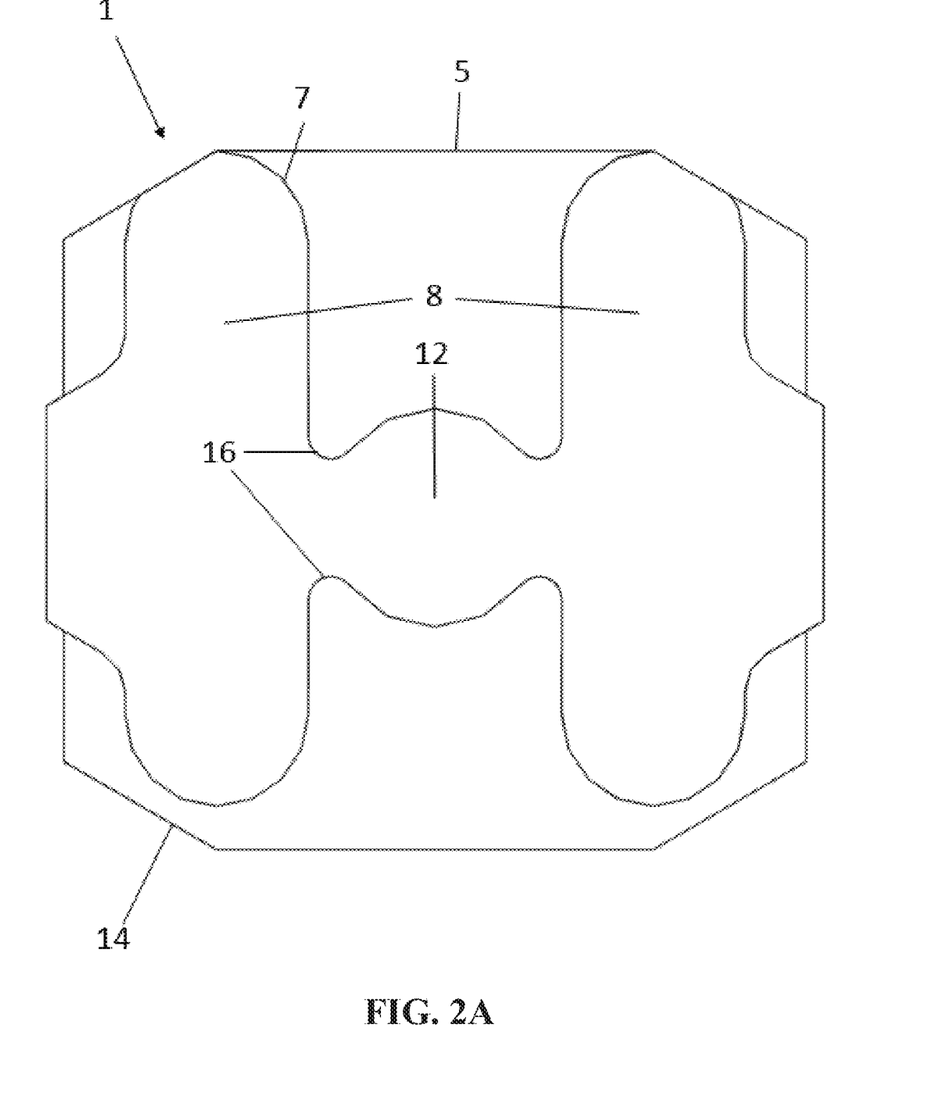
FIG. 2A illustrates a front view of the cable retention device from outside an enclosure, in accordance with embodiments of the present disclosure.

FIG. 2A is a front view of the cable retention device 1 from outside the enclosure, in accordance with embodiments of the present disclosure. The outer and inner cutouts 5, 7 are configured to at least partially overlap. The inner cutout 7 includes spaced vertical slotted cutouts 8 connected by the center cutout 12. The center cutout 12 may be sized and shaped to form a plurality of pinch points 16 to facilitate receiving and retaining projections and attachments within the vertical slotted cutouts 8 and the center cutout 12.

References to relative dimensions such as length, height, and depth are exemplary and merely for ease of understanding aspects of the embodiments described herein. In regards to the relative dimensions for FIGS. 2A and 2B, length means the horizontal distance along the cable retention device 1 (e.g., the distance between the peripheral tab cutouts). Height means the vertical distance along the cable retention device 1 (e.g., the distance between the rounded top and bottom portions of the vertical slotted cutouts 8). Depth means the distance going directly into the cable retention device 1 (e.g., thickness of the planar layers). Reference to angles of the corners 14 are to be understood in reference from the bottom right corner on the outer cutout 5. For example, the bottom right corner is angled 30° from the horizontal base. This angle is mirrored onto other corners of the outer cutout 5.

Figure 2B:
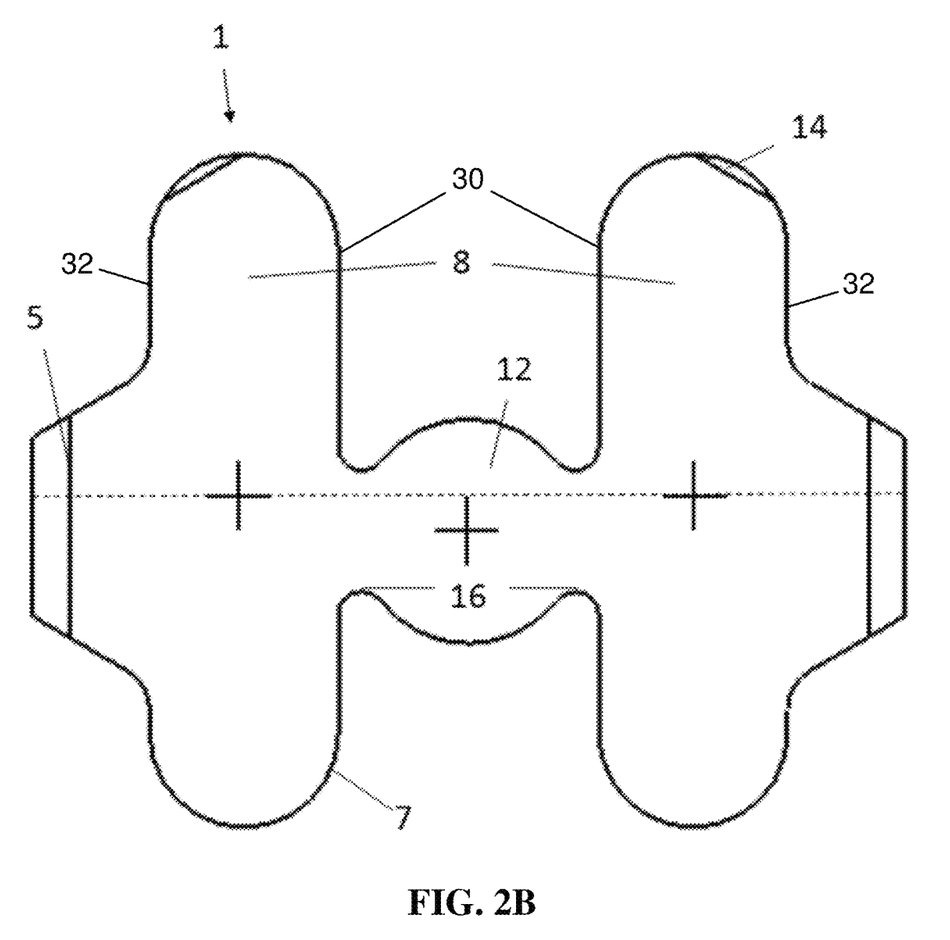
FIG. 2B illustrates a front view of the cable retention device from inside an enclosure, in accordance with embodiments of the present disclosure.

In various embodiments, the outer cutout 5 is substantially square shaped and has a length of 10-25 mm, a height of 10-25 mm, and a depth of 1-5 mm. The peripheral tab cutouts 10 may have a length of 0.1-5 mm, and the corners 14 may be angled at 5°-70°. In some embodiments, the outer cutout 5 may have a length of 17-19 mm, a height of 15-18 mm and a depth of 2.5-3.5 mm. In some embodiments, the peripheral tab cutouts may have a length of 0.1-2 mm and the corners may be angled at 20°-40°.

FIG. 2B is a front view of the cable retention device 1 from inside the enclosure, in accordance with embodiments of the present disclosure. In this embodiment, the center point of the center cutout 12 is biased below a line connecting the horizontal center points of the vertical slotted cutouts 8, with an offset distance denoted "D." In some embodiments, the offset distance "D" can be customized (e.g., determined) according to the needs of the end user (e.g., according to the type of projections the user intends to use). This configuration reduces the risk of tie attachments escaping pinch points 16, especially under the influence of gravity. This bias may also make installing tie attachments easier, as feeding the attachment over the shorter inner wall of the vertical slotted cutouts 8 may require less contortion of the attachment. However, it should be noted that the center cutout 12 is not biased below the horizontal center in all embodiments. In some embodiments, the center cutout 12 may be substantially aligned with or above the horizontal center of the vertical slotted cutouts 8. As depicted in FIG. 2B, the vertical slotted cutouts 8 each include inner edges 30 and outer edges 32.

In some embodiments, the corners 14 may overlap the inner cutout 7 to facilitate immobilizing projections within the corners 14. In various embodiments, the inner cutout 7 may have a length of 10-25 mm, a height of 10-25 mm, and a depth of 1-5 mm. The vertical slotted cutouts 8 may have a length of 2-8 mm with 2-8 mm spacing between the inner walls. The center cutout 12 may have a diameter of 2.5-10 mm depending on the spacing between the vertical slotted cutouts 8 and the preferred size and placement of pinch points 16. In some embodiments, the inner cutout 7 may have length of 18-20 mm, a height of 15-18 mm, and a depth of 1-3 mm. In some embodiments, the vertical slotted cutouts 8 may have a length of 3-5 mm with 5-7 mm spacing between the inner walls. Furthermore, in some embodiments, the center cutout 12 may have a diameter of 4-6 mm. Some embodiments may be designed to be compatible with projections (e.g., hex bolt 20) or VELCRO® Strap tie attachments, but may be modified to accommodate any specific projection or tie attachment.

All sizes, dimensions, and angles described herein, both relative and absolute, are exemplary and not to be construed as limiting.

Figure 3A:
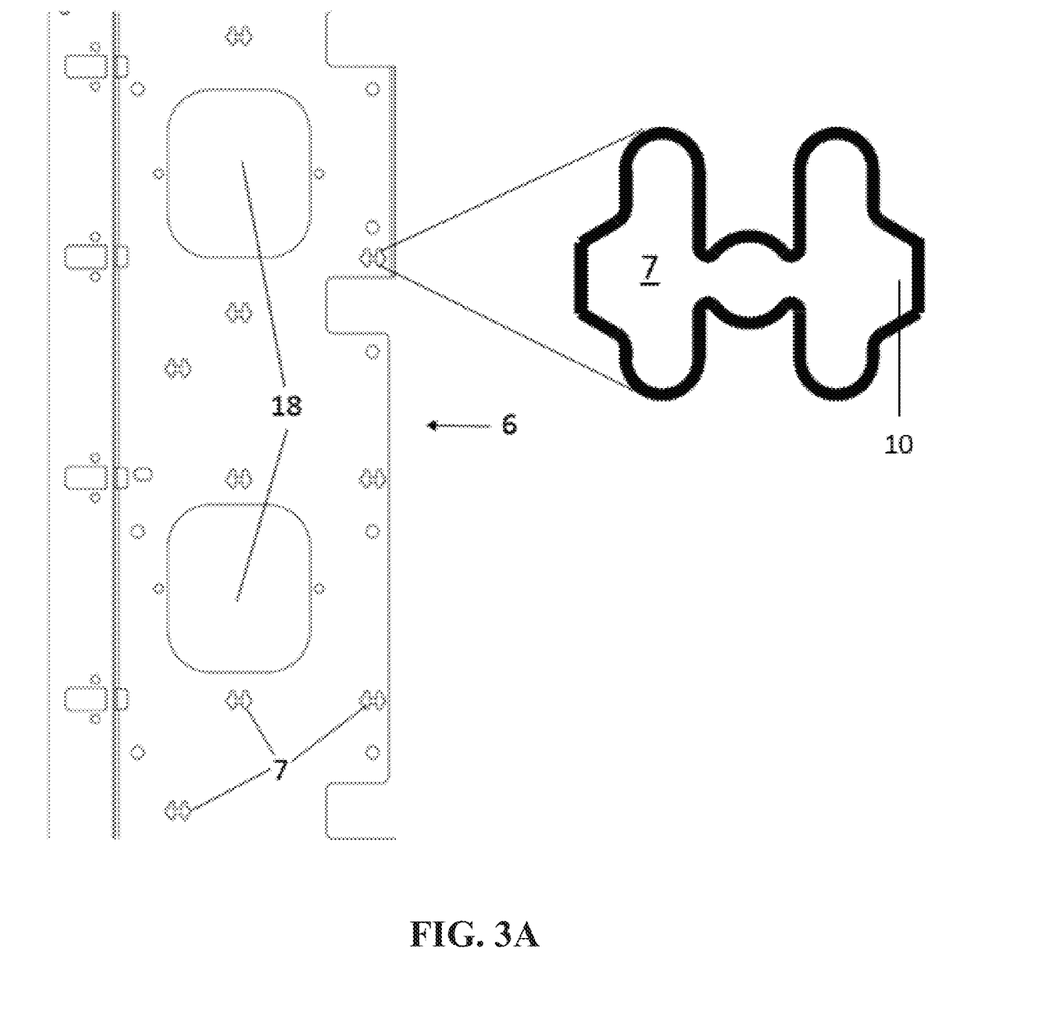
FIG. 3A is a view of the inner planar layer of a side panel with the inner cutout, in accordance with embodiments of the present disclosure.
Figure 3B:
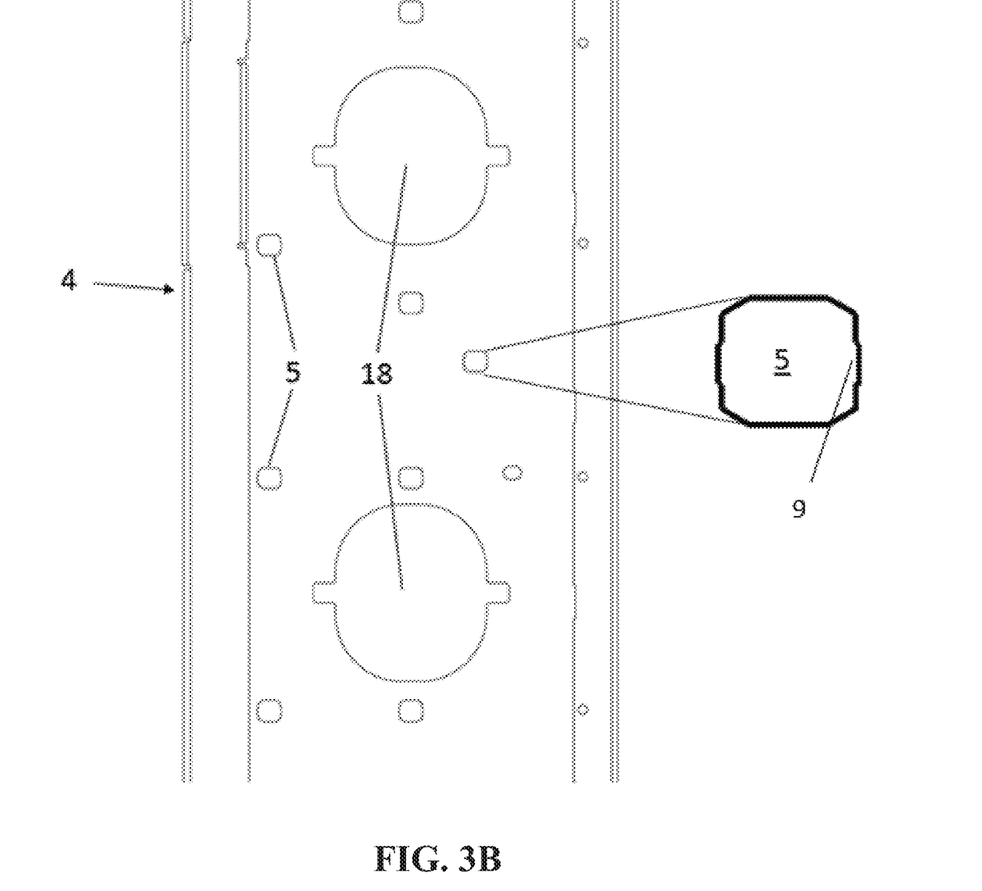
FIG. 3B is a view of the outer planar layer of the side panel with the outer cutout, in accordance with embodiments of the present disclosure.

FIG. 3A illustrates the inner planar layer 6 of a side panel of an enclosure having inner cutouts 7 and trunk cable cutouts 18. FIG. 3B illustrates the outer planar layer 4 of a side panel on an enclosure having outer cutouts 5 and trunk cable cutouts 18. The outer and inner cutouts 5, 7 are depicted with outer and inner peripheral tab cutouts 9, 10 on each respective figure. The outer and inner planar layers 4, 6 may be manufactured with outer and inner cutouts 5, 7 before or after attaching the layers. The outer and inner planar layers 4, 6 may be attached to each other via welding, hardware assembly, riveting, brazing, soldering, gluing, or any other means of fastening the layers together. The outer and inner planar layers 4, 6 may also be formed on a single sheet and bent thereafter to overlap the inner and outer cutouts 5, 7. The inner and outer planar layers 4, 6 may be planar panels (e.g., thin, flat pieces of material, such as sheet metal) manufactured using any suitable material, including metals, polymers, wood, glass, composites, and ceramics. The attachment method may be selected appropriately depending on the material selected for the outer and inner planar layers. Furthermore, the attachment method may be selected to be minimally obstructive with the enclosure and components therein. The enclosure may also be modified to include materials with sound or EMF dampening properties. The EMF dampening material may be inherent to the enclosure or added after manufacturing the enclosure. In some embodiments, the enclosure is manufactured from sheet metal for durability. This allows the enclosure to endure shipping environments.

The trunk cable cutout 18 may be used to feed cables and wires into and out of the enclosure. Optical fibers are a good example of such wires as they are frequently used in computer network settings due to their ability to quickly transmit data. Large servers may require a plurality of optical fiber cables. For this reason, optical fiber cables are typically bundled together in single cable, also known as a trunk cable. As the trunk cable runs vertically or horizontally through the enclosure, a tie attachment secured to the cable retention device 1 (as shown in FIGS. 1A-2B, see also the discussion below regarding FIG. 4) may fasten the cable to a surface on an enclosure to provide organization and security while managing multiple cables. Properly managing cable layout in a high-density storage area network may avoid problems associated with congested or disorganized systems, such as overheating, obstructed airflow, unwanted bending of cables, or difficulty modifying the server set-up.

Figure 4:
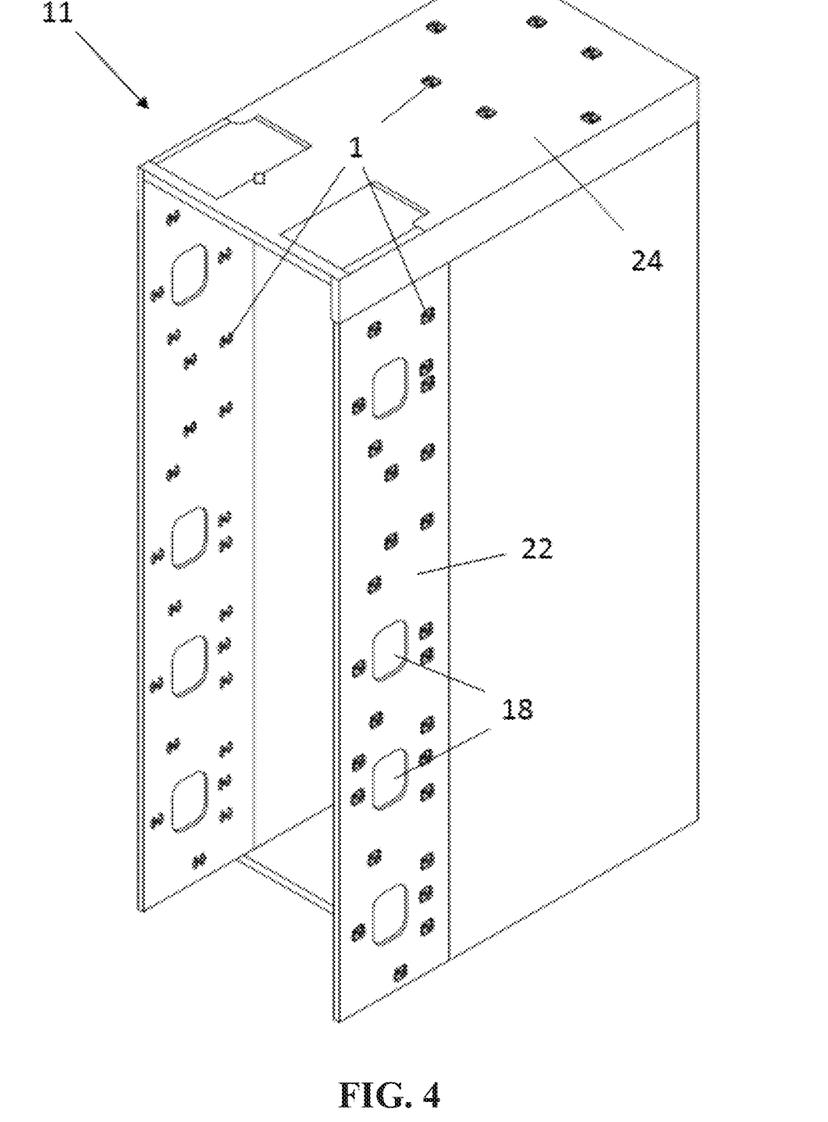
FIG. 4 illustrates an enclosure having top and side panels with cable retention devices, in accordance with embodiments of the present disclosure.

FIG. 4 illustrates the cable retention device 1 on an enclosure 11. Several cable retention devices 1 and trunk cable cutouts 18 may be disposed on the enclosure at various locations. Cable retention devices 1 may be formed with any suitable manufacturing method (e.g., punching, stamping, CNC machining, cutting, or pressing into the outer and inner planar layers 4, 6). In some embodiments, the manufacturer may utilize a double punch to simultaneously stamp each layer. In other embodiments, the layers are punched individually and positioned to align the cutouts. In sheet metal enclosure embodiments, these manufacturing methods allow the cable retention device 1 to be placed closer to extruding features within the enclosure 11 as compared to protruding cutouts. Protruding cutouts may require additional spacing from sheet metal features to allow the metal to bend. Furthermore, protruding cutouts may require more space to access the cutout, which can be obstructed if placed in proximity to a sheet metal feature. The cable retention device 1 may be flush with both surfaces of the surrounding material to ensure it is not obstructive with cabling or other components of the enclosure, such as PDUs, water manifolds, brackets, or shelves. In the embodiment depicted in FIG. 4, the cable retention device is disposed on the side panel 22 and top panel 24 of the cabinet enclosure 11. However, the cable retention device 1 may be placed on any other location on the enclosure and is not limited to the embodiments described. In some embodiments, the cable retention device 1 is formed on shelves, brackets, or any surface on the chassis.

Figure 5:
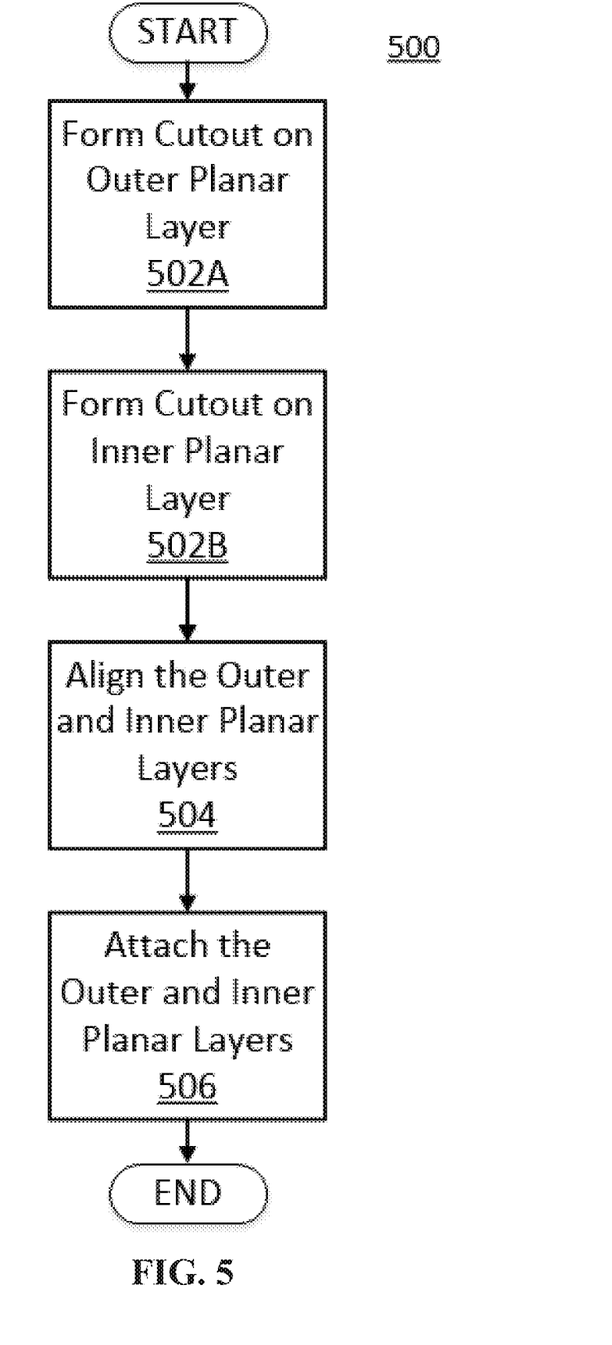
FIG. 5 illustrates an example method for manufacturing the cable retention device, in accordance with embodiments of the present disclosure.

FIG. 5 illustrates a flowchart of an example method 500 for manufacturing a cable retention device 1, in accordance with embodiments of the present disclosure. Operations 502A and 502B relate to forming cutouts on the planar layers. The cutouts may be substantially the same as the outer and inner cutouts 5, 7. The planar layers may be substantially the same as the outer and inner planar layers 4, 6. Forming each cutout on its respective layer may be done with any suitable manufacturing method, such as stamping, punching, CNC machining, cutting, or pressing into the layers. Furthermore, the cutouts may be formed on each layer in any order, or simultaneously. Operations 502A and 502B may be completed in any order, or simultaneously. In some examples, the layers may be simultaneously punched with a double stamp. In some embodiments, the cutouts are individually punched into each layer in any order.

At operation 504, the planar layers are aligned. The planar layers may be aligned so the outer and inner cutouts at least partially overlap. At operation 506, the planar layers are attached. Attachment may be done via welding, hardware assembly, riveting, brazing, soldering, gluing, or any other means of fastening the layers together. The aforementioned operations may be completed in any order and are not limited to those described. In some embodiments, the planar layers are first aligned and attached, then subsequently formed with cutouts. In some embodiments, the cutouts are formed on the planar layers and then are aligned and attached.

Example method 500 for manufacturing a cable retention device 1 may be completed based on the type of projection selected. For example, a user may first select the desired type of projection or attachment (e.g., ¾" hex bolt, ½" screw, zip-tie, d-ring). Afterwards, the user may determine the necessary inner and outer cutout dimensions to accommodate the projection or attachment. In some embodiments, the inner and outer cutouts may accommodate both a projection and attachment. In some embodiments, the inner and outer cutout may accommodate a variety of attachments or projections on the same cable retention device. Lastly, the user may form the cutouts with any suitable manufacturing method based on the determined dimensions.

The inner and outer cutout dimensions such as the center cutout, vertical slotted cutouts, corners, pinch points, and peripheral tab cutouts may be selected to accommodate specific projections or attachments. The center cutout, vertical slotted cutouts, corners, pinch points, and peripheral tab cutouts may be substantially the same as the center cutout 12, the vertical slotted cutouts 8, the corners 14, the pinch points 16, and the outer and inner peripheral tab cutouts 9, 10 previously described. In screw embodiments, the inner and outer cutout features may be rounded. For example, the peripheral tab cutouts may be rounded to facilitate receiving and retaining a screw head. Additionally, the center cutout may be substantially circular shaped to facilitate receiving and retaining the screw body. Furthermore, the pinch points and corners may be filleted to accommodate the shape of the screw head and body. The vertical slotted cutouts may be rounded on the top and bottom to accommodate the diameter of the screw. In hex bolt embodiments, the peripheral tab cutouts may be straight edged to facilitate receiving and retaining a hex bolt head. In this embodiment, the corners may be chamfered at an angle of 30° from the base to accommodate the 120° internal angles of a hex bolt.

In VELCRO® Strap embodiments, the distance between the pinch points 16 may be smaller than the width of the strap to facilitate retaining the strap within the vertical slotted cutouts. In this embodiment, the center point of the center cutout may be biased below a line connecting the center points of the vertical slotted cutouts. This may reduce the risk of the VELCRO® Strap escaping the pinch points, especially under the influence of gravity. Furthermore, it may require less contortion of the VELCRO® Strap during attachment. In embodiments which utilize both a screw/bolt and a VELCRO® Strap, the center cutout diameter may be larger than the distance between inner edges (e.g., the edges closest to the other vertical slotted cutout and the center cutout) of the vertical slotted cutouts. This configuration may allow accommodation of the diameter of the screw/bolt body within the center cutout and the thickness of the VELCRO® Strap within the vertical slotted cutouts.

The aforementioned operations may be completed by a computer (e.g., by a processor connected to a memory device that includes computer code to cause the processor to perform the aforementioned operations). Likewise, the computer may cause another machine to complete the aforementioned operations. In some embodiments, a user defines the cut dimensions based on the selected projection and inputs the cut dimensions into a computer. The computer may then cause a machine to make the desired cuts. Various machines may be instructed to make the cuts, such as a CNC mill, waterjet cutter, plasma cutter, laser cutter, or flame cutter. In some embodiments, the user may select the type of projection and configure a computer to determine the cut dimensions based on the projection type. For example, a user may select which type of projection to use, input the projection type into the computer, allow the computer to calculate the size and shape of the cutout based on the projection type, and then cause a machine to make the cuts. This may allow accurate compatibility between the sought projections or attachments and the cable-tie point. A computer may also be used to align and attach the planar layers. This may ensure accurate alignment between the inner and outer cutouts. It may additionally ensure the attachment method does not obstruct components within the enclosure or breach outside the enclosure space.

A variety of examples and embodiments are presented in this disclosure. These examples may be referred to as exemplary. Note that the term "exemplary," as used in this disclosure, simply means an example, instance, or illustration. This term is not used to mean that a particular example is superior, commendable, or otherwise deserving of imitation over other examples. While the foregoing is directed to exemplary embodiments, other and further embodiments of the invention may be devised without departing from the basic scope thereof, and the scope thereof is determined by the claims that follow.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method of manufacturing comprising:
   forming an outer cutout on a first panel;
   forming an inner cutout on a second panel, wherein the inner cutout includes a pair of substantially parallel vertical slotted cutouts connected by a center cutout to form a plurality of pinch points between the pair of vertical slotted cutouts; and
   attaching the first panel and the second panel, wherein the outer cutout and the inner cutout at least partially overlap.

2. The method of claim 1, wherein the outer cutout includes a first pair of peripheral tab cutouts spaced apart on opposite ends of the outer cutout, and wherein the inner cutout includes a second pair of peripheral tab cutouts spaced apart on opposite ends of the inner cutout.

3. The method of claim 2, wherein forming the inner and outer cutouts includes:
   determining a size and a shape of a projection;
   determining a size and a shape of the center cutout, the vertical slotted cutouts and the first and second pair of peripheral tab cutouts based on the size and shape of the projection; and
   forming the center cutout, the vertical slotted cutouts, and the first and second pair of peripheral tab cutouts based on the size and the shape of the projection.

4. The method of claim 1, wherein the outer cutout is substantially square shaped with filleted corners.

5. The method of claim 1, wherein forming the inner and outer cutouts comprises cutting the inner and outer cutouts into the first and second panels using computer numerical controlled machining.

6. The method of claim 1, wherein attaching the first and second panels comprises:
   aligning the first and second panels such that the inner and outer cutouts at least partially overlap; and
   welding the first and second panels together.

7. The method of claim 1, wherein the center cutout is substantially circular shaped.

8. The method of claim 1, wherein a center of the center cutout is disposed below a line connecting center points of the vertical slotted cutouts.

9. A method comprising:
   providing a device, the device comprising:
     an inner planar layer having an inner cutout, wherein the inner cutout includes a pair of substantially parallel vertical slotted cutouts connected by a center cutout to form a plurality of pinch points between the pair of vertical slotted cutouts, wherein the vertical slotted cutouts each include inner and outer edges; and
     an outer planar layer having an outer cutout,
     wherein the outer and inner planar layers are attached and an area defined by the outer cutout at least partially overlaps an area defined by the inner cutout,
     wherein the inner cutout and the outer cutout are formed by removing material from the inner and outer planar layers, respectively.

10. The method of claim 9, wherein the outer cutout includes a first pair of peripheral tab cutouts spaced apart on opposite ends of the outer cutout, and wherein the inner cutout includes a second pair of peripheral tab cutouts spaced apart on opposite ends of the inner cutout.

11. The method of claim 10, wherein the first and second pairs of peripheral tab cutouts are configured to receive and retain a projection.

12. The method of claim 9, wherein the outer cutout is substantially square shaped with chamfered corners.

13. The method of claim 12, wherein the chamfered corners are configured to receive and retain a projection.

14. The method of claim 9, wherein the center cutout is configured to receive and retain a projection.

15. The method of claim 9, wherein the outer and inner planar layers are attached via welding.

16. The method of claim 9, wherein the outer and inner planar layers form panels on an enclosure.

17. The method of claim 9, wherein the plurality of pinch points are filleted.

18. The method of claim 9, wherein the center cutout is substantially circular shaped.

19. The method of claim 9, wherein the center cutout has a diameter that is greater than a distance between the inner edges of the pair of vertical slotted cutouts.

20. The method of claim 9, wherein a center of the center cutout is disposed below a line connecting a pair of center points of the vertical slotted cutouts.

* * * * *